United States Patent [19]
Ohdate

[11] Patent Number: 4,792,844
[45] Date of Patent: Dec. 20, 1988

[54] PRESSURE CONTACT SEMICONDUCTOR DEVICE

[75] Inventor: Mitsuo Ohdate, Itami, Japan

[73] Assignee: Mitsubishi Denki Kabushiki Kaisha, Tokyo, Japan

[21] Appl. No.: 75,218

[22] Filed: Jul. 20, 1987

Related U.S. Application Data

[63] Continuation of Ser. No. 751,670, Jul. 3, 1985, abandoned.

[30] Foreign Application Priority Data

Jul. 5, 1984 [JP] Japan .......................... 59-102590[U]

[51] Int. Cl.$^4$ ...................... H01L 23/42; H01L 23/02
[52] U.S. Cl. ......................................... 357/79; 357/74
[58] Field of Search ..................................... 357/74, 79

[56] References Cited

U.S. PATENT DOCUMENTS 3,683,342  8/1972  Meyerhoff et al. ................... 357/79
3,950,778  4/1976  Pomper et al. ...................... 357/79

FOREIGN PATENT DOCUMENTS 665744   6/1963  Canada.
884591  10/1971  Canada.

Primary Examiner—William L. Sikes
Assistant Examiner—Georgia Y. Epps
Attorney, Agent, or Firm—Birch, Stewart, Kolasch & Birch

[57] ABSTRACT

A semiconductor device includes a support member; a semiconductor element mounted on the support member; an elastic body which places the semiconductor element in pressure-contact with the support member; a cylindrical body for containing the semiconductor element and the elastic body, the lower end of the cylindrical body being fixed to the support member; and a plurality of curved projections produced so as to be in contact with the upper end of the elastic body by curving at least three points of the top end of the cylindrical body while pressure is applied to the semiconductor element through the elastic body.

2 Claims, 2 Drawing Sheets

FIG. 1.(PRIOR ART)
FIG. 2.(PRIOR ART)
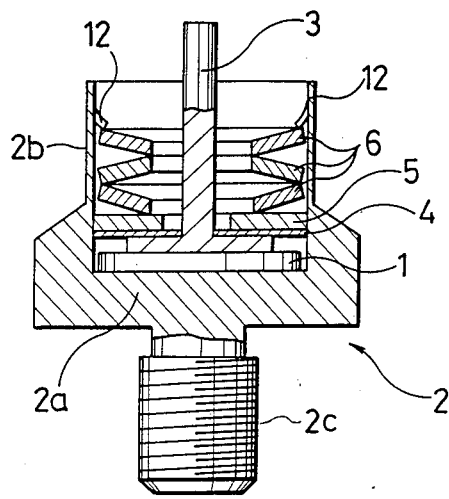
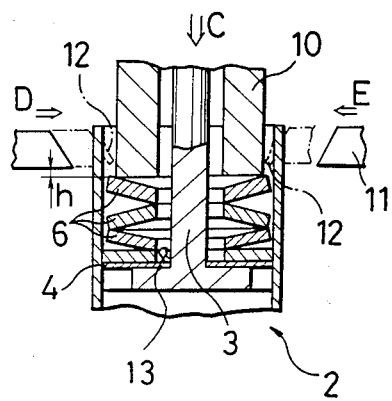
FIG. 3.
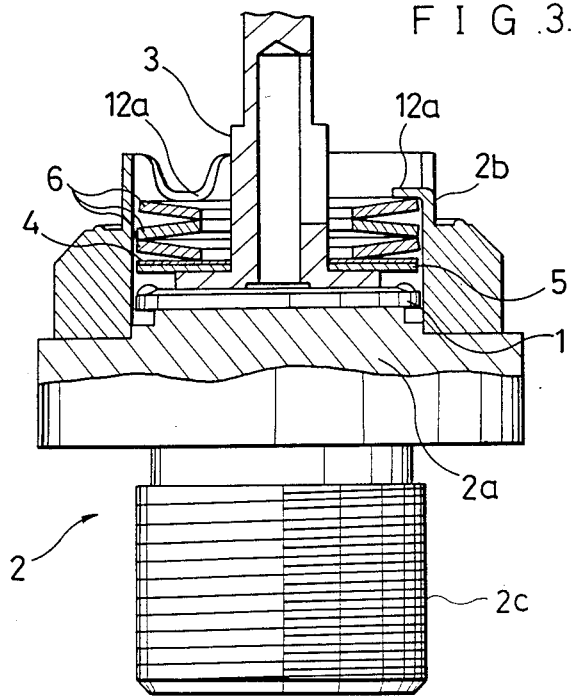

F I G 4.
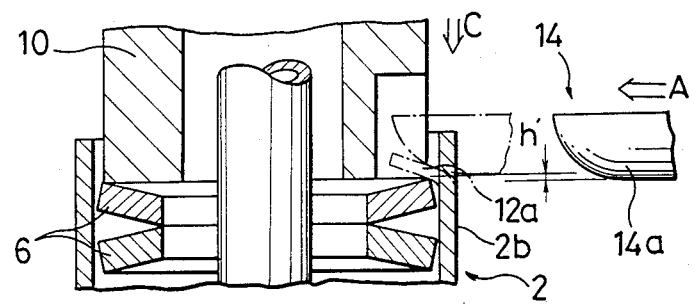

PRESSURE CONTACT SEMICONDUCTOR DEVICE

This application is a continuation, of application Ser. No. 751,670 filed on July 3, 1985, now abandoned.

FIELD OF THE INVENTION

The present invention relates to a pressure-contact type semiconductor device, and more particularly, to an improvement of a mechanism for keeping contact pressure.

BACKGROUND OF THE INVENTION

Generally, a semiconductor element and an electrode are held by pressure through a pan spring in a pressure-contact type semiconductor device so as to ease the conductivity of electricity and heat. Proposed pressure holding mechanisms, include a screw type, a snap ring type, and a mechanism disclosed in Japanese Published Patent specification No. Sho. 46-35213 in which several points of a case are broken to produce projections which push down the pan spring to maintain the pressure.

A diode as such a pressure-contact type prior art semiconductor device will be described in the following with reference to FIG. 1:

The reference numeral 1 designates a semiconductor element. The numeral 2 designates a case comprising a support portion 2a, a cylindrical body portion 2b produced integrally therewith, and a screw portion 2c produced below the support portion 2a. This case 2 constitutes an anode. The numeral 3 designates an electrode rod which constitutes a cathode. The numeral 6 designates a pan spring. The numeral 4 designates an insulating washer. The semiconductor element 1 is mounted on the support portion 2a of the case 2, and the electrode rod 3 is mounted on the semiconductor element 1. The insulating washer 4, the washer 5, and the pan springs 6 are provided through the electrode rod 3.

The production method of this device is described with reference to FIG. 2:

A pedetermined load is applied to the pan spring 6 by a pressure applying apparatus 10 in the direction of arrow C, and three bites 11 (two are shown in FIG. 2) arranged outside the case 2 are operated as shown in dotted lines in the directions of arrows D and E, respectively, thereby breaking the outside wall of the case 2 to produce projections 12 inside thereof. Then, it is necessary to provide a small gap (h) between the upper surface of the pan spring 6 and the lower surface of the bite 11 because it is difficult to produce projections 12 so as to be in closely contact with the upper surface of the pan spring 6. However, if this gap (h) becomes close to 0, the pan springs 6 and/or the bite 11 are broken. On the other hand, if the gap (h) has a some value, the bending dimension of the pan spring 6 varies and the spring load is reduced to a great extent.

When the pressure applying apparatus 10 is removed from the upper surface of the pan spring 6 after the projections 12 are produced, the upper portions of the pan springs 6 come into contact with the lower ends of the projections 12. Then, the projections 12 may deform in the upward direction by the reactive spring force of the pan springs 6, and the bending dimension of the pan-spring 6 varies similarly as described above, thereby reducing the spring load to a greater extent. Hereupon, the pressure applied to the semiconductor element 1 is designed at about 100 kg/cm$^2$ taking into consideration the electrical and thermal resistances.

Furthermore, when the case 2 is broken by the bites 11, broken pieces 13 are generated from the case 2. These broken pieces 13 fall down on the insulating washer 4, and can short-circuit the washer 4 and the electrode rod 3 which are insulated with the case 2, thereby lowering the quality of the electric of the characteristics.

In this type of mechanism for holding the semiconductor element, it is impossible to keep the load of the pan spring 6 at a constant level, and the broken pieces 13 fall down separated from the case 2, thereby lowering the electrical characteristics.

SUMMARY OF THE INVENTION

The present invention is directed to solving the problems pointed out above, and has for its object to provide a semiconductor device capable of keeping the load of the pan spring at a constant value regardless of the positional accuracy of the projections, and furthermore capable of preventing a reduction of the quality of the electric characteristics by preventing the broken generation of pieces.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, there is provided a semiconductor device, which comprises: a support member; a semiconductor element mounted on the support member; an elastic body which places the semiconductor element in pressure-contact with the support member; a cylindrical body for containing the semiconductor element and the elastic body, the lower end of the cylindrical body being fixed to the support member; and a plurality of curved projections produced so as to be in contact with the upper end of the elastic body by curving at least three points of the top end of the cylindrical body while pressure is applied to the semiconductor element through the elastic body.

BRIEF DESCRIPTION OF THE DRAWINGS

FIG. 1 is a cross-sectional view of a prior art semiconductor device;

FIG. 2 is a partial cross-sectional view for explaining the production method of the device of FIG. 1;

FIG. 3 is a cross-sectional view of a semiconductor device according to one embodiment of the present invention; and FIG. 4 is a partial cross-sectional view for explaining the method of producing the curved portion of the device of FIG. 3.

DETAILED DESCRIPTION OF THE PREFERRED EMBODIMENTS

In order to explain one embodiment of the present invention in detail, reference will be particularly made to FIG. 3 wherein the same reference numerals are used to designate the same or corresponding parts or elements as those shown in FIG. 1:

In this embodiment, the case 2 is made of SS41 (steel for structure construction), the internal diameter of the case is 24 mm$\pm_{0.1}^{0.15}$, and the thickness thereof is 1 mm.

The diameter of the semiconductor element 1 contained in this case 2 is 24 mm$\pm_{0.1}^{0.5}$. The pan spring 6 is made of chromium vanadium steel, and the ppring pressure thereof is 100 kg/cm$^2$. The projections 12a are produced by curving the upper end portions of the cylindrical body portions 2b of the case 2 inwards. The width of a curved projection 12a is 5 mm, and the length thereof is greater than 1 mm.

These curved projections 12a are produced in the following manner.

The case curving apparatus 14 has at least three curving members 14a, and there is provided a gap (h') between the lower surface of the curving member 14a and the lower surface of the pressure applying apparatus 10. This gap (h') is set to a value almost the same as or smaller than the thickness of the cylindrical body portion 2b of the case 2. The left-and-rightwards movement of the case curving apparatus 14 is linked with the up-and-downwards movement of the pressure applying apparatus 10.

In order to produce the curved projections 12a of the case 2, a predetermined load is applied to the pan springs 6 by the pressure applying apparatus 10 in a direction of arrow C. Under this condition, the curving member 14a of the curving apparatus 14 which is operationally linked with the pressure applying apparatus 10 is pushed inwards, that is, in a dircction of arrow A, so as to curve or fold the upper end of the case 2 by the top portion of the curving member 14a, thereby producing a curved projection 12a. The pushing out length of the curving member 14a is determined so that the thickness of the curved projection 12a may become approximately equal to that of the side wall of the case 2 with taking into consideration the gap (h') and that the case 2 is pushed to curve by the curved portion at the top end of the curving member 14. The curved projections 12a produced in such a manner apply a predetermined load to the semiconductor element through the pan springs 6.

As is evident from the foregoing, the curved projections 12a are produced under a condition that a predetermined pressure is applied to the pan springs 6. Accordingly, there does not arise a restoration of the bending of the pan spring 6, and there also does not arise a deformation of the curved projection 12a by the pan spring 6. Also there does not arise a variation of the spring load. Furthermore, the curved projection 12a is produced by curving the upper end of the case 2, resulting in no generation of broken picces, and accordingly no deterioration of the electric characteristics. Thus, the reliability of the device is enhanced.

What is claimed is:

1. A semiconductor device, which comprises:

a support member;

a semiconductor element mounted on said support member;

an elastic body with an upper elastic body end and a lower elastic body end, siad elastic body contacting said semiconductor element at said lower elastic body end, said elastic body providing pressure on said semiconductor element, and said elastic body forcing said semiconductor element into pressure contact with said support member;

a cylindrical body with a lower cylindrical body end and an upper cylindrical body end that has a top, said cylindrical body containing said semiconductor element and said elastic body in a container area, and said cylindrical body being fixed to said support member at said lower cylindrical body end; and a plurality of folded curved projections on said top of said upper cylindrical body end, said curved projections being formed so as to be in contact with said elastic body at said upper elastic body end, said curved projections being formed by folding at least three points of said top of said upper cylindrical body end into said container area while said elastic body applied constant pressure to said semiconductor element.

2. A semiconductor device according to claim 1, wherein said elastic body is a pan spring.

* * * * *